(12) United States Patent
Chen et al.

(10) Patent No.: US 10,535,386 B2
(45) Date of Patent: Jan. 14, 2020

(54) LEVEL SHIFTER WITH BYPASS

(71) Applicant: ARM Limited, Cambridge (GB)

(72) Inventors: Andy Wangkun Chen, Austin, TX (US); Yew Keong Chong, Austin, TX (US); Rahul Mathur, Austin, TX (US); Abhishek Baradia, Austin, TX (US); Hsin-Yu Chen, Austin, TX (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/603,252

(22) Filed: May 23, 2017

(65) Prior Publication Data
US 2018/0342271 A1 Nov. 29, 2018

(51) Int. Cl.
G11C 8/06 (2006.01)
G11C 8/10 (2006.01)

(52) U.S. Cl.
CPC . G11C 8/10 (2013.01); G11C 8/06 (2013.01)

(58) Field of Classification Search
CPC .............................................. H03K 19/018507
USPC ......................................................... 327/333
See application file for complete search history.

(56) References Cited

U.S. PATENT DOCUMENTS

| | | | |
|---|---|---|---|
| 6,084,430 A | 7/2000 | Wayner | |
| 6,147,540 A | 11/2000 | Coddington | |
| 6,346,829 B1 | 2/2002 | Coddington | |
| 6,700,407 B1 | 3/2004 | Wert | |
| 6,717,452 B2 | 4/2004 | Carpenter et al. | |
| 6,965,251 B1 | 11/2005 | Tran et al. | |
| 7,129,751 B2 | 10/2006 | Jahan et al. | |
| 7,173,472 B2 | 2/2007 | Chen et al. | |
| 8,258,848 B2 | 9/2012 | Chen | |
| 8,339,177 B2 | 12/2012 | Jarrar et al. | |
| 8,421,516 B2 | 4/2013 | Kumar et al. | |
| 8,558,603 B2 | 10/2013 | Hess et al. | |
| 8,598,936 B2 | 12/2013 | Kuge et al. | |
| 8,872,570 B2 | 10/2014 | Wu | |
| 9,054,660 B1* | 6/2015 | Ramalingam | H03G 1/0088 |
| 9,299,421 B1* | 3/2016 | Lien | G11C 7/1051 |
| 9,515,660 B1* | 12/2016 | Samson | H03K 19/01850 |
| 9,647,660 B1 | 5/2017 | Alam et al. | |
| 2005/0077919 A1* | 4/2005 | Sowden | G06F 1/3203 326/62 |

(Continued)

FOREIGN PATENT DOCUMENTS

EP 2680441 A2 1/2014

OTHER PUBLICATIONS

Kim, et al.; SLC: Split-Control Level Converter for Dense and Stable Wide-Range Voltage Conversion; Proceedings of the ESSCIRC; IEEE; pp. 478-481; Sep. 17, 2012. DOI: 10.1109/ESSCIRC.2012.6341359.

(Continued)

Primary Examiner — Min Huang
(74) Attorney, Agent, or Firm — Pramudji Law Group PLLC; Ari Pramudji

(57) ABSTRACT

Various implementations described herein refer to an integrated circuit having level shifting circuitry and bypass switching circuitry. The level shifting circuitry is arranged for translating an input signal from a first voltage domain to an output signal for a second voltage domain. The bypass switching circuitry is arranged for activating and deactivating the level shifting circuitry based on a bypass control signal.

18 Claims, 3 Drawing Sheets

(56) References Cited

U.S. PATENT DOCUMENTS

| | | |
|---|---|---|
| 2006/0255835 A1 | 11/2006 | Cordoba |
| 2010/0264976 A1 | 10/2010 | Duby et al. |
| 2011/0102383 A1 | 5/2011 | Cho |
| 2012/0133416 A1 | 5/2012 | Ogawa |
| 2012/0280739 A1* | 11/2012 | Foley ............... H03K 3/356165 327/333 |
| 2014/0002146 A1 | 1/2014 | Kim |
| 2014/0078815 A1* | 3/2014 | Hollis ................ G11C 29/1201 365/149 |
| 2014/0097888 A1 | 4/2014 | Lee |
| 2014/0117953 A1 | 5/2014 | Hoefler et al. |
| 2016/0036441 A1 | 2/2016 | Dey et al. |
| 2016/0036445 A1 | 2/2016 | Dey et al. |
| 2016/0211847 A1 | 7/2016 | Duby et al. |
| 2016/0294373 A1* | 10/2016 | Grubelich ........ H03K 3/356104 |
| 2017/0012627 A1* | 1/2017 | Kapoor ............ H03K 19/01850 |
| 2017/0041002 A1 | 2/2017 | Dey et al. |
| 2017/0288673 A1 | 10/2017 | Nadkarni et al. |

OTHER PUBLICATIONS

UKIPO Search Report; GB 1413492.8; dated Jan. 13, 2015.
UKIPO Search Report; GB 1413490.2; dated Jan. 14, 2015.
Lee, et al.; Wide-Range 5.0/3.3/1.8-V I/O Buffer Using 0.35-μm 3.3-V CMOS Technology; IEEE Transactions on Circuits and Systems I, Regular Papers; vol. 56, No. 4; Apr. 2009.
Chen, et la.; An Output Buffer for 3.3-V Applications in a 0.13-μm 1/2.5-V CMOS Process; IEEE Transactions on Circuits and Systems II, Express Briefs; vol. 54, No. 1; Jan. 2007.
Annema, et al.; 5.5-V I/O in a 2.5-V 0.25-μm CMOS Technology; IEEE Journal of Solid-State Circuits; vol. 36, No. 3; Mar. 2001.

* cited by examiner

300

310 — fabricating an integrated circuit for supporting large range level shifting to enable dynamic voltage frequency scaling in multiple voltage domains

320 — fabricating level shifting circuitry with multiple transistors arranged for translating an input signal from a first voltage domain to an output signal for a second voltage domain that is different than the first voltage domain

330 — fabricating bypass switching circuitry with a bypass transistor that operates as a switch for activating and deactivating the level shifting circuitry based on a bypass control signal, wherein deactivating the level shifting circuitry with the bypass switching circuitry increases speed performance of the integrated circuit by providing a quicker path for the input signal to propagate through the integrated circuit

FIG. 3

LEVEL SHIFTER WITH BYPASS

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In modern circuit design, memory and related mechanisms support dual voltage rails for bitcell core (VDDCE) and periphery circuitry (VDDPE). VDDCE lowering is limited by bitcell retention voltage and is held at higher voltages compared to VDDPE. However, VDDPE lowering is usually limited by internal circuitry. Typically, VDDPE may potentially limit power savings on chip. Large range level shifting may require level shift of all inputs inside memory from low VDDPE to higher VDDCE domain, which may enable VDDPE to be lower than VDDCE. However, a disadvantage is that this implementation may cause delay penalty to all signals going through level shifters inside memory, which may lead to timing degradation, such as memory access time and input pins setup time.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

FIG. 3 illustrates a process diagram of a method for fabricating level shifting circuitry with bypass in accordance with implementations described herein.

DETAILED DESCRIPTION

Various implementations described herein refer to and are directed to schemes and techniques for implementing level shifting circuitry with bypass. For instance, various implementations described herein provide schemes and techniques associated with level shifting circuitry for translating an input signal from a first voltage domain to an output signal for a second voltage domain and includes bypass switching circuitry for activating and deactivating the level shifting circuitry based on a bypass control signal. Further, in some scenarios, the schemes and techniques provided herein may provide a high-speed level shifter with programmable bypass. Thus, various implementations described herein may provide reliable circuitry that allows for large range level shifting in memory circuitry by implementing a programmable bypass option for high speed applications.

Accordingly, various implementations for providing level shifting circuitry (or level shifters) with bypass will now be described with reference to FIGS. 1-3.

Figure 1:
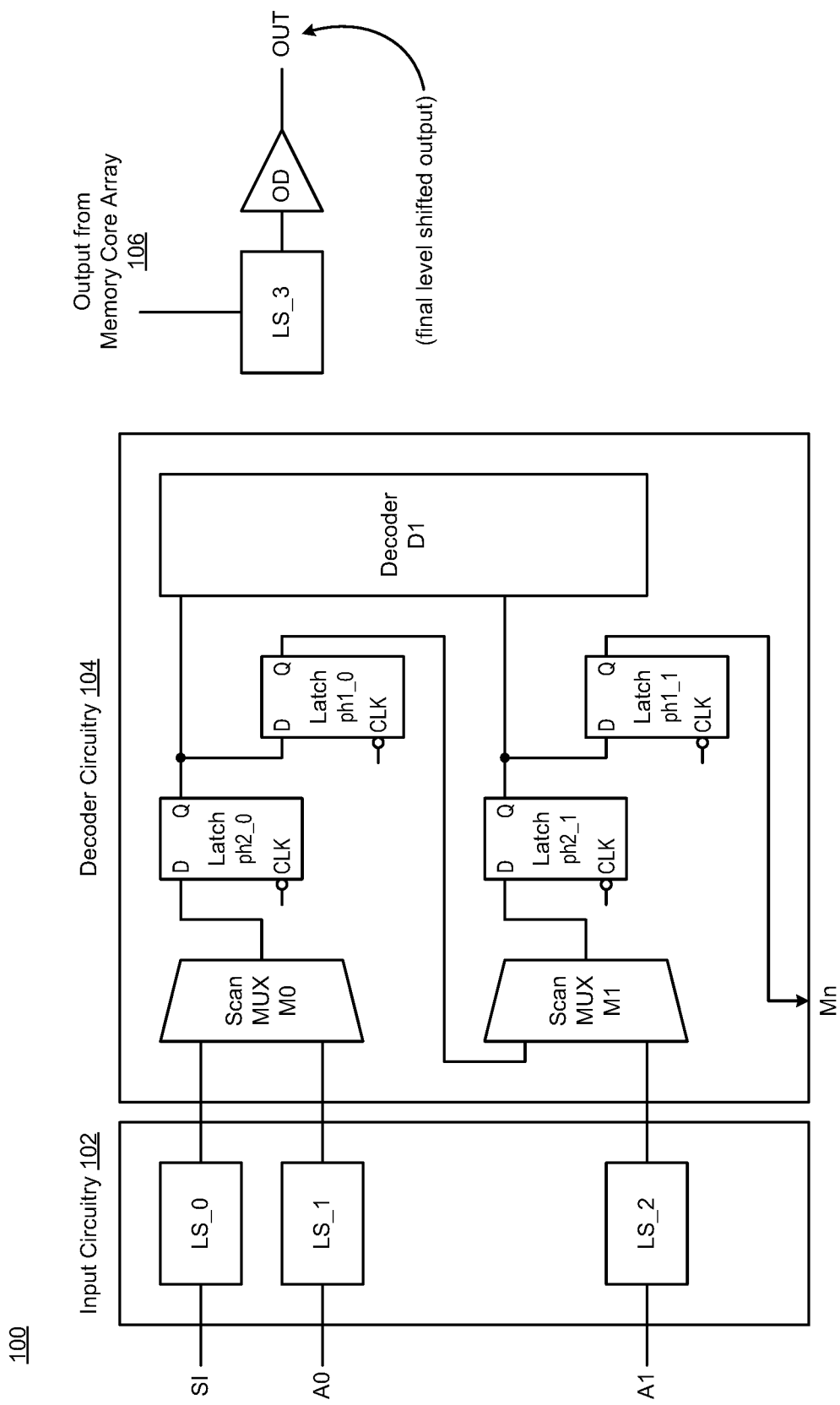
FIG. 1 illustrates a diagram of memory circuitry utilizing level shifting circuitry with bypass in accordance with implementations described herein.

FIG. 1 illustrates a block diagram of memory circuitry 100 using level shifting circuitry (LS) with bypass control functionality in accordance with various implementations described herein. As shown, the memory circuitry 100 may include associated circuitry, such as, e.g., input circuitry 102, decoder circuitry 104 and output from a memory core array 106 that may be implemented as an integrated circuit (IC) in various types of memory applications, such as, e.g., random access memory (RAM), and/or any other types of memory, including any type of volatile and non-volatile memory. In some cases, the memory circuitry 100 may be implemented as an IC with single or dual rail memory architecture. In other cases, the memory circuitry 100 may be integrated with various types of computing circuitry and/or various related components on a single chip. Further, the memory circuitry 100 may be implemented in an embedded system for various electronic and mobile applications.

As shown in FIG. 1, the input circuitry 102 may receive a signal input (SI) and one or more address signal inputs (A0, A1, . . . , An). The input circuitry 102 may include level shifting circuitry (LS_0, LS_1, LS_2) that may receive corresponding signal inputs (SI, A0, A1, etc.) and provide a level shifted output or a bypass signal output. The level shifting circuitry (LS_0, LS_1, LS_2) may be configured to translate the input signals (SI, A0, A1, etc.) from a first voltage domain to an output signal for a second voltage domain, and further, the level shifting circuitry (LS_0, LS_1, LS_2) may include bypass switching circuitry for activating and deactivating the level shifting circuitry (LS_0, LS_1, LS_2) based on a bypass control signal. The level shifting circuitry (LS_0, LS_1, LS_2) is further described herein below in reference to FIG. 2. The second voltage domain may be different than the first voltage domain. For instance, in some implementations, the first voltage domain may be derived from a system-on-a-chip (SOC) logic voltage supply (VDDSOC), and the second voltage domain may be derived from a core voltage supply (VDDCE) or, in some cases, a periphery voltage supply (VDDPE).

The memory circuitry 100 may include a memory macro for a single port having one or more scan multiplexers M0, M1, one or more latches ph1, ph2, and a decoder D1 arranged to receive the signal inputs (SI, A0, A1, etc.). The first scan multiplexer M0 may receive the signal input (SI) and the first address signal (A0), as level shifted signals. The first scan multiplexer M0 may provide the first address signal (A0) or the signal input (SI) to the latch ph2_0, and the latch ph2_0 may receive and provide the first address signal (A0) or the signal input (SI) to the latch ph1_0 and the decoder D1 based on a clock signal (CLK). The latch ph1_0 may receive and provide the first address signal (A0) or the signal input (SI) to the second scan multiplexer M1 based on the clock signal (CLK).

The second scan multiplexer M1 may receive the second address signal (A1) and then provide the first address signal (A0), the signal input (SI) or the second address signal (A1) to another latch ph2_1 based on the clock signal (CLK). The latch ph2_1 may receive and provide the first address signal (A0), the signal input (SI) or the second address signal (A1) to another latch ph1_1 and the decoder D1 based on the clock signal (CLK). Further, as shown, the latch ph1_1 may receive and provide the first address signal (A0), the signal input (SI) or the second address signal (A1) as output to another scan multiplexer Mn (not shown) based on the clock signal (CLK).

The output from the memory core array 106 may include level shifting circuitry (LS_3) and an output driver (OD). As shown, one or more signals (SI, A0, A1, etc.) received from the latches ph1_0, ph1_1 may be received by the decoder D1, and the decoder D1 may provide a decoded signal to level shifting circuitry (LS_3). The level shifting circuitry (LS_3) may be configured to translate the input signals (SI, A0, A1, etc.) between first and second voltage domains, and the level shifting circuitry (LS_3) may include bypass switching circuitry for activating and deactivating the level shifting circuitry (LS_3) based on a bypass control signal, as described herein below in reference to FIG. 2. Further, as shown, the output driver (OD) of the output from the memory core array 106 may receive a level shifted signal from the level shifting circuitry (LS_3) and provide an output signal (OUT), which may include a final level shifted output.

In some implementations, the decoder circuitry 104 may comprise a scan cell having one or more D-flip-flops (DFFs). Generally, the DFF is a positive edge (posedge) triggered storage device. Internally, some DFFs may be provided with a ph2 D-latch (e.g., latch is open, when the clock is low) and a ph1 D-latch (e.g., latch is open, when the clock is high). The output Q of the DFF may serve as a scan output (SO) signal. As shown in FIG. 1, the decoder circuitry D1 may be configured as a MUX-DFF type scan cell having one or more multiplexers (MUXs), ph2 D-latches, and ph1 D-latches.

In reference to capturing and addressing input in RAM type macros, a memory may be described by processing a single transaction with each rise edge of a clock. For instance, to capture an address input during scan based testing, the ph1 latch may be added to the existing data paths, as shown in FIG. 1. The ph2 latch may be a functional latch that holds an address value while bitcells in the existing data paths are processed (i.e., memory bitcell transactions are initiated when clock is high). The ph1 latch may provide an effective scan DFF for addressing, and in this instance, the decoder circuitry D1 in FIG. 1 may be referred to as a RAM address observe cell.

Figure 2:
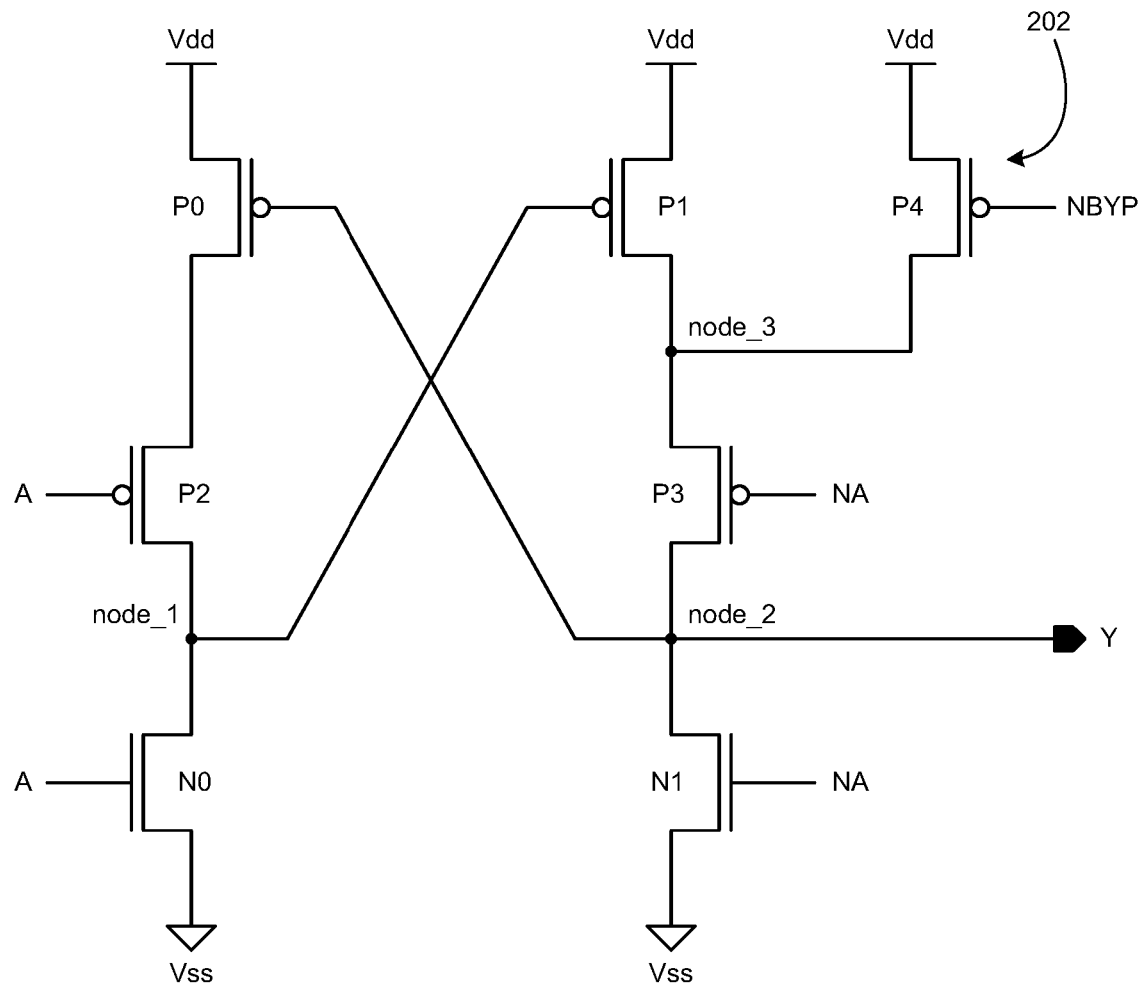
FIG. 2 illustrates a schematic diagram of level shifting circuitry with bypass in accordance with implementations described herein.

FIG. 2 illustrates a diagram of level shifting circuitry 200 with bypass transistor P4 in accordance with implementations described herein. FIG. 2 provides level shifter circuitry that allows for a large range of level shifting with a programmable bypass option for high speed applications. Further, FIG. 2 also provides a schematic for level shifter circuitry having input/output pins, including, e.g., input signal NA (VDDSOC domain), input signal A as an inverted input (VDDSOC domain), bypass signal NBYP as an input to turn the bypass feature ON or OFF (VDDCE domain), and output signal Y as a level shifted output signal for NA (VDDCE domain).

The circuitry 200 may be implemented as an integrated circuit (IC) when utilized in various types of memory applications, such as, e.g., a scan cell for random access memory (RAM), and/or any other types of memory, including any type of volatile and non-volatile memory. The circuitry 200 may be implemented as an IC with single or dual rail memory architecture, such as, e.g., single or dual port memory architecture. The circuitry 200 may be integrated with various types of computing circuitry and/or various related components on a single chip. The circuitry 200 may be implemented in an embedded system for various electronic and mobile applications. The circuitry 200 as an integrated circuit (IC) may be configured for memory applications that support large range level shifting to enable dynamic voltage frequency scaling in multiple voltage domains.

FIG. 2 shows level shifting circuitry 200 for translating an input signal (A) from a first voltage domain to an output signal (Y) for a second voltage domain. As shown, the level shifting circuitry 200 may implement bypass switching circuitry 202 for activating and deactivating the level shifting circuitry 200 based on a bypass control signal (NBYP). The second voltage domain may be different than the first voltage domain. For instance, the first voltage domain may be derived from a system-on-a-chip (SOC) logic voltage supply (VDDSOC), and the second voltage domain may be derived from a core voltage supply (VDDCE) or, in some cases, a periphery voltage supply (VDDPE).

In some implementations, the level shifting circuitry 200 may include a plurality of transistors (P0, P1, P2, P3, N0, N1) arranged for translating the input signal (A) from the first voltage domain to the output signal (Y) for the second voltage domain. As shown, the plurality of transistors (P0, P1, P2, P3, N0, N1) may include multiple p-type metal-oxide-semiconductor (PMOS) transistors (P0, P1, P2, P3) and multiple n-type MOS (NMOS) transistors (N0, N1) that may be arranged for translating the input signal (A) from the first voltage domain to the output signal (Y) for the second voltage domain.

As shown in FIG. 2, the transistors P0, P2, N0 may be coupled in series (i.e., stacked) between a first supply voltage (Vdd) and a second voltage supply (Vss or Gnd), and the transistors P1, P3, N1 may be coupled in series (i.e., stacked) between the first supply voltage (Vdd) and the second voltage supply (Vss or Gnd). The transistors P2, N0 may receive input signal (A) via gates thereof, and a first node (node_1) may be disposed therebetween. The transistors P3, N1 may receive complementary input signal (NA) via gates thereof, and a second node (node_2) may be disposed therebetween. Further, as shown in FIG. 2, the transistors P0, P1 may be cross-coupled via the first node (node_1) and the second node (node_2). Further, as shown, the output signal (Y) may be provided as output via the second node (node_2).

The bypass switching circuitry 202 may include at least one bypass transistor P4 that is coupled to the level shifting circuitry 200. As shown, the bypass transistor P4 may be implemented with a PMOS transistor. However, in other implementations, the bypass transistor may be implemented with an NMOS transistor. The bypass transistor P4 may operate as a switch for activating and deactivating the level shifting circuitry 200 based on the bypass control signal (NBYP). As shown in FIG. 2, the bypass transistor P4 may be disposed between the first voltage supply (Vdd) and a third node (node_3), which is disposed between the transistors P1, P3.

In some instances, when the bypass control signal NBYP is logical 0, the bypass transistor P4 is ON, and Vdd is allowed to pass through P4 to node_3. It may be assumed that the NBYP pin will already assume a correct logical state before the input pin (A) transitions. Sometimes, any input pin to the memory may be directly connected to the NA input. When NA is logical 0, Vdd passes through P3 to node_2, which is the output Y, as shown in FIG. 2. Therefore, an effective delay of the level shifting circuitry 200 may be a single stage delay (i.e., NA→Y). In other instances, when the bypass control signal NBYP is logical 1, the bypass transistor P4 is OFF, and Vdd is allowed to pass through P1 to node_3 based on the logical state of node_1. Therefore, an effective delay of the level shifting circuitry 200 may be a multiple stage delay, such as, e.g., a three stage delay (i.e., NA→A, A→node_1, node_1→node_3).

In some scenarios, deactivating the level shifting circuitry 200 with the bypass switching circuitry 202 increases speed performance of the integrated circuit by providing a quicker path for the input signal (A) to propagate through the integrated circuit. Further, deactivating the level shifting circuitry 200 with the bypass switching circuitry 202 reduces timing delay of the integrated circuit by allowing the input signal (A) to bypass the level shifting circuitry 200. In other scenarios, activating the level shifting circuitry 200 with the bypass switching circuitry 202 increases timing delay of the integrated circuit by passing the input signal (A) through the level shifting circuitry 200.

One advantage of the level shifter circuitry 200 is that, during times when SOC is not using DVFS (Dynamic Voltage and Frequency Scaling), where VDDSOC=VDDCE, and where memory PPA (Power, Performance and Area) may be important, the pin-programmable option may be used to turn the bypass transistor ON. In this instance, the transistor gate may be coupled to the NBYP pin input, which may be controlled by the SOC. Further, in some instances, turning the bypass transistor ON may provide a quicker path for the input signal to propagate through the circuit thereby reducing timing delay that it may have taken through a conventional level shifter without the bypass option.

Further, in reference to FIG. 1, during bypass mode ON, level shifting circuitry (LS) may have a single stage delay penalty, and during bypass mode OFF, level shifting circuitry (LS) may have a multiple stage delay (e.g., 2 or 3 stage delay penalty). Overall, from a memory timing perspective, at the PPA corner, the bypass option may be turned ON to thereby reduce timing delay penalties related to setup times at the input circuitry 102 and memory access time (CLK-to-Q) at the output OUT.

FIG. 3 illustrates a process flow diagram of a method 300 for fabricating level shifting circuitry with bypass in accordance with implementations described herein.

It should be understood that even though method 300 may indicate a particular order of operation execution, in some cases, various certain portions of the operations may be executed in a different order, and on different systems. In some other cases, additional operations and/or steps may be added to and/or omitted from method 300. Further, method 300 may be implemented in hardware and/or software. If implemented in hardware, the method 300 may be implemented with various circuit components, such as described herein above in reference to FIGS. 1-2. If implemented in software, the method 300 may be implemented as a program or software instruction process that may be configured for implementing level shifting circuitry with bypass as described herein above. Further, if implemented in software, various instructions related to implementing the method 300 may be stored or recorded in various types of memory. For instance, a computer, a server, or various other types of computing devices having a processor and memory may be configured to perform the method 300.

In reference to FIG. 3, method 300 may be utilized for manufacturing and implementing level shifting circuitry with bypass. In some implementations, at block 310, method 300 may fabricate an integrated circuit for supporting large range level shifting to enable dynamic voltage frequency scaling in multiple voltage domains.

At block 320, method 300 may fabricate level shifting circuitry with multiple transistors arranged for translating an input signal from a first voltage domain to an output signal for a second voltage domain that is different than the first voltage domain. The first voltage domain may be derived from a logic voltage supply (VDDSOC). The second voltage domain may be derived from a core voltage supply (VDDCE) or, in some cases, a periphery voltage supply (VDDPE). The level shifting circuitry may utilize a plurality of transistors arranged for translating the input signal from the first voltage domain to the output signal for the second voltage domain. The plurality of transistors may include PMOS and NMOS transistors that are arranged for translating the input signal from the first voltage domain to the output signal for the second voltage domain.

At block 330, method 300 may fabricate bypass switching circuitry with at least one bypass transistor that operates as a switch for activating and deactivating the level shifting circuitry based on a bypass control signal. In some scenarios, deactivating the level shifting circuitry with the bypass switching circuitry may increase speed performance of the integrated circuit by providing a quicker path for the input signal to propagate through the integrated circuit. The bypass switching circuitry may include at least one bypass transistor that is coupled to the level shifting circuitry.

Described herein are implementations of an integrated circuit. The integrated circuit may include level shifting circuitry for translating an input signal from a first voltage domain to an output signal for a second voltage domain. The integrated circuit may include bypass switching circuitry for activating and deactivating the level shifting circuitry based on a bypass control signal.

Described herein are implementations of an integrated circuit. The integrated circuit may include level shifting circuitry having a plurality of transistors arranged for translating an input signal from a first voltage domain to an output signal for a second voltage domain that is different than the first voltage domain. The integrated circuit may include bypass switching circuitry having a bypass transistor that operates as a switch for activating and deactivating the level shifting circuitry based on a bypass control signal.

Described herein are various implementations of a method for manufacturing an integrated circuit. The method may include fabricating level shifting circuitry with multiple transistors arranged for translating an input signal from a first voltage domain to an output signal for a second voltage domain that is different than the first voltage domain. The method may include fabricating bypass switching circuitry with a bypass transistor that operates as a switch for activating and deactivating the level shifting circuitry based on a bypass control signal. Further, deactivating the level shifting circuitry with the bypass switching circuitry may increase speed performance of the integrated circuit by providing a quicker path for the input signal to propagate through the integrated circuit.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   level shifting circuitry that translates an input signal from a first voltage domain to an output signal for a second voltage domain, the level shifting circuitry having a first plurality of transistors and a second plurality of transistors coupled in parallel between a first supply voltage and a second supply voltage, wherein:
      the second plurality of transistors include a first p-type transistor and a second p-type transistor coupled in series between the first supply voltage and an output node, and
      the second plurality of transistors include an n-type transistor coupled between the output node and the second supply voltage; and
   bypass switching circuitry having a bypass transistor coupled between the first supply voltage and an intermediate node, wherein the intermediate node is disposed between the first p-type transistor and the second p-type transistor of the second plurality of transistors, and wherein the bypass transistor activates and deactivates the level shifting circuitry based on a bypass control signal.

2. The integrated circuit of claim 1, wherein the second voltage domain is different than the first voltage domain.

3. The integrated circuit of claim 1, wherein the first voltage domain is derived from a system-on-a-chip (SOC) logic voltage supply (VDDSOC), and wherein the second voltage domain is derived from a core voltage supply (VDDCE).

4. The integrated circuit of claim 1, wherein the first supply voltage comprises a voltage supply related to Vdd, and wherein the second supply voltage comprises a voltage supply related to ground (Vss or GND).

5. The integrated circuit of claim 1, wherein the first p-type transistor and the second p-type transistor comprise p-type metal-oxide semiconductor (PMOS) transistors, and wherein the n-type transistor comprises an n-type metal-oxide semiconductor (NMOS) transistor.

6. The integrated circuit of claim 1, wherein the bypass transistor comprises a p-type metal-oxide-semiconductor (PMOS) transistor, and wherein the bypass transistor operates as a switch for activating and deactivating the level shifting circuitry based on the bypass control signal.

7. The integrated circuit of claim 1, wherein deactivating the level shifting circuitry with the bypass switching circuitry increases speed performance of the integrated circuit by providing a quicker path for the input signal to propagate through the integrated circuit.

8. The integrated circuit of claim 1, wherein activating the level shifting circuitry with the bypass switching circuitry increases timing delay of the integrated circuit by passing the input signal through the level shifting circuitry.

9. The integrated circuit of claim 1, wherein deactivating the level shifting circuitry with the bypass switching circuitry reduces timing delay of the integrated circuit by allowing the input signal to bypass the level shifting circuitry.

10. The integrated circuit of claim 1, wherein the integrated circuit is configured for memory applications that support large range level shifting to enable dynamic voltage frequency scaling in multiple voltage domains.

11. An integrated circuit, comprising:
    level shifting circuitry having a first plurality of transistors and a second plurality of transistors arranged for translating an input signal from a first voltage domain to an output signal for a second voltage domain that is different than the first voltage domain, wherein:
       the first plurality of transistors include a first p-type metal-oxide-semiconductor (PMOS) transistor and a second PMOS transistor coupled in series between a voltage supply and a first node,
       the first plurality of transistors include a first n-type MOS (NMOS) transistor coupled between the first node and ground,
       the second plurality of transistors include a third PMOS transistor and a fourth PMOS transistor coupled in series between the voltage supply and a second node, the second plurality of transistors include a second NMOS transistor coupled between the second node and ground, the first node is coupled to a gate of the third PMOS transistor, and the second node is coupled to a gate of the first PMOS transistor; and bypass switching circuitry having a bypass transistor coupled between the voltage supply and a third node, wherein the third node is disposed between the third PMOS transistor and the fourth PMOS transistor, and wherein the bypass transistor operates as a switch for activating and deactivating the level shifting circuitry based on a bypass control signal.

12. The integrated circuit of claim 11, wherein the first voltage domain is derived from a system-on-a-chip (SOC) logic voltage supply (VDDSOC), and wherein the second voltage domain is derived from a core voltage supply (VDDCE).

13. The integrated circuit of claim 11, wherein deactivating the level shifting circuitry with the bypass switching circuitry increases speed performance of the integrated circuit by providing a quicker path for the input signal to propagate through the integrated circuit.

14. The integrated circuit of claim 11, wherein activating the level shifting circuitry with the bypass switching circuitry increases timing delay of the integrated circuit by passing the input signal through the level shifting circuitry.

15. The integrated circuit of claim 11, wherein deactivating the level shifting circuitry with the bypass switching circuitry reduces timing delay of the integrated circuit by allowing the input signal to bypass the level shifting circuitry.

16. The integrated circuit of claim 11, wherein the integrated circuit is configured for memory applications that support large range level shifting to enable dynamic voltage frequency scaling in multiple voltage domains.

17. A method for manufacturing an integrated circuit, the method comprising:

fabricating level shifting circuitry with multiple transistors arranged for translating an input signal from a first voltage domain to an output signal for a second voltage domain that is different than the first voltage domain, wherein:

the multiple transistors include a first p-type transistor and a second p-type transistor coupled in series between the first voltage domain and an output node, and the multiple transistors include an n-type transistor coupled between the output node and the second voltage domain associated with ground; and fabricating bypass switching circuitry with a bypass transistor coupled between the first voltage domain and an intermediate node, wherein the intermediate node is disposed between the first p-type transistor and the second p-type transistor, and wherein the bypass transistor operates as a switch for activating and deactivating the level shifting circuitry based on a bypass control signal, and wherein deactivating the level shifting circuitry with the bypass switching circuitry increases speed performance of the integrated circuit by providing a quicker path for the input signal to propagate through the integrated circuit.

18. The method of claim 17, wherein the integrated circuit is configured for memory applications that support large range level shifting to enable dynamic voltage frequency scaling in multiple voltage domains.

* * * * *